(12) United States Patent
Hong et al.

(10) Patent No.: US 6,822,870 B2
(45) Date of Patent: Nov. 23, 2004

(54) RETAINING APPARATUS

(75) Inventors: James Hong, Nantou (TW); Alex Hsia, Banchiau (TW); Chin-Ming Chen, Taoyuan (TW)

(73) Assignee: Delta Electronics, Inc. (TW)

(*) Notice: Subject to any disclaimer, the term of this patent is extended or adjusted under 35 U.S.C. 154(b) by 0 days.

(21) Appl. No.: 10/461,458

(22) Filed: Jun. 16, 2003

(65) Prior Publication Data

US 2004/0200045 A1 Oct. 14, 2004

(30) Foreign Application Priority Data

Apr. 11, 2003 (TW) .................................. 92205658 U

(51) Int. Cl.⁷ .................................................. H05K 7/20
(52) U.S. Cl. ...................... 361/704; 361/695; 361/697; 257/718; 257/719; 257/722; 257/727; 165/80.3; 24/458; 248/510

(58) Field of Search ................................. 361/695, 704, 361/707, 709, 719–721; 165/80.2, 80.3, 185; 174/16.3; 257/718, 719, 727; 24/453, 458

(56) References Cited

U.S. PATENT DOCUMENTS

| | | | | |
|---|---|---|---|---|
| 5,302,853 A | * | 4/1994 | Volz et al. ................... | 257/707 |
| 6,421,242 B1 | * | 7/2002 | Chen .......................... | 361/704 |
| 6,449,157 B1 | * | 9/2002 | Chu ........................... | 361/704 |
| 6,450,248 B1 | * | 9/2002 | Chang ........................ | 165/80.3 |
| 2003/0142478 A1 | * | 7/2003 | Huang et al. ............... | 361/704 |
| 2003/0209341 A1 | * | 11/2003 | Deboer et al. ............. | 165/80.3 |

* cited by examiner

*Primary Examiner*—Boris Chérvinsky

(57) ABSTRACT

A retaining apparatus is formed with a retaining arm and a retainer clip. The retaining arm is formed combining two joint arms. After combining the two joint arms, those joint arms still have a specific action space. The retainer clip is combined with the retaining arm.

20 Claims, 4 Drawing Sheets

RETAINING APPARATUS

BACKGROUND OF THE INVENTION

1. Field of Invention

The invention relates a retaining apparatus and, in particular, to a retaining apparatus that can be readily mounted or separated without using additional tools.

2. Related Art

In a computer, the central processing unit (CPU) usually generates the most heat. If the heat is not immediately removed, the CPU may be easily burned. Therefore, the CPU surface is usually mounted a heat sink for rapidly removing the heat it generates.

However, if the heat sink is not tightly mounted on the CPU, the heat ventilation may not be effective enough. Therefore, the heat sink is conventionally combined with the CPU via some retaining apparatus.

The retaining apparatus in the prior art has an elastic retaining arm and a retaining frame. Through the elastic force between the retaining arm and the retaining frame, the heat sink is tightly pressed against the CPU.

However, in the conventional retaining apparatus structure, additional retaining tools (such as the Phillips screw driver) and an appropriate force are required to combine or separate the retaining arm and the retaining frame. In order to avoid the use of additional tools, a retaining apparatus is also designed in the prior art. Such retaining apparatuses have to be installed with an extra retaining structure with a specific structure. The combing and separating actions are completed through a series of complicated procedures. Therefore, not only do they have a higher manufacturing cost, it is also impossible to complete the combining or separating action in a simple way.

SUMMARY OF THE INVENTION

In view of the foregoing, the invention proposes a retaining apparatus that can be easily mounted or separated without using additional tools, shortening the manipulating time.

The invention also proposes a retaining apparatus that can be readily mounted or separated through a simple action, shortening the manipulating time.

To achieve the above objectives, the invention provides a retaining apparatus comprised of a retaining arm and a retainer clip. The retaining arm is formed by combining two joint arms. After combining the two joint arms, those joint arms still have a specific action space. The retainer clip is combined with the retaining arm.

The disclosed retaining apparatus further contains a base, which connects to the retainer clip. An action mechanism exists between the retainer clip and the base.

Moreover, the disclosed retaining apparatus includes a retaining frame that matches with the retaining arm. The retainer clip combines or separates the retaining arm and the retaining frame through the above-mentioned action mechanism.

When a heat sink and a heat-generating component are held between the retaining frame and the base, the action mechanism presses the heat sink tightly against the heat-generating component. Furthermore, the heat sink can be installed with a fan to accelerate heat dissipation. The base can have a combining part for the connection of the fan.

The disclosed retaining apparatus can simultaneously have multiple retaining arms.

According to the disclosed retaining apparatus, the retaining arm is formed by combining two joint arms. After combining the two joint arms, those joint arms still have a few action space. Therefore, the retaining size of the retaining arm can be readily adjusted. It is thus easy to install the retaining arm on the retaining frame or a substrate by imposing only a small force.

Furthermore, one can rotate the retainer clip to readily combine or separate the retaining arm with the retaining frame or substrate. Therefore, the disclosed retaining apparatus does not require additional tools or special techniques in order to be mounted or separated.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

The present invention will be apparent from the following detailed description, which proceeds with reference to the accompanying drawings, wherein the same references relate to the same elements.

Figure 1:
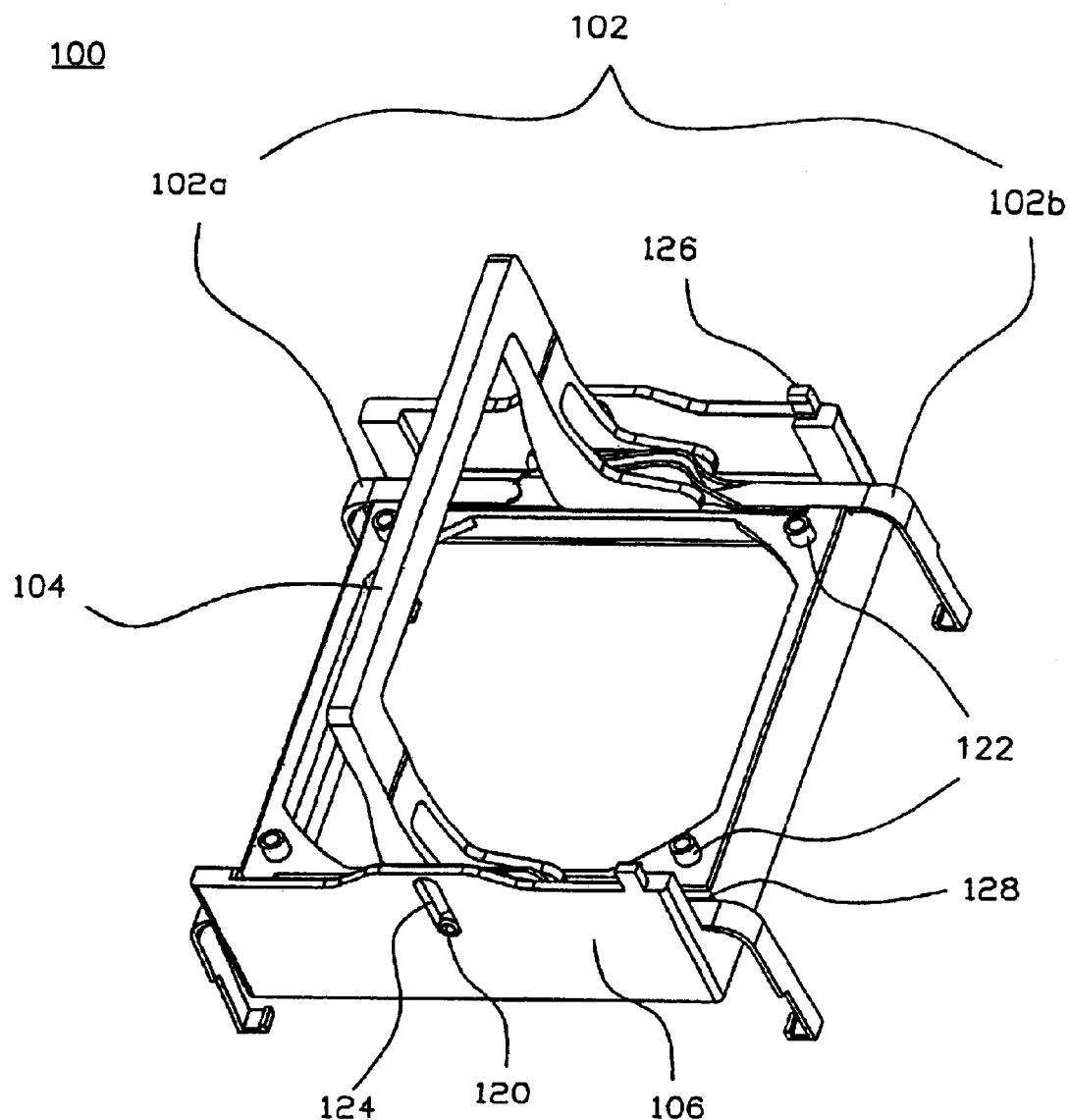
FIG. 1 is a schematic view of the retaining apparatus in a preferred embodiment of the invention.
Figure 2:
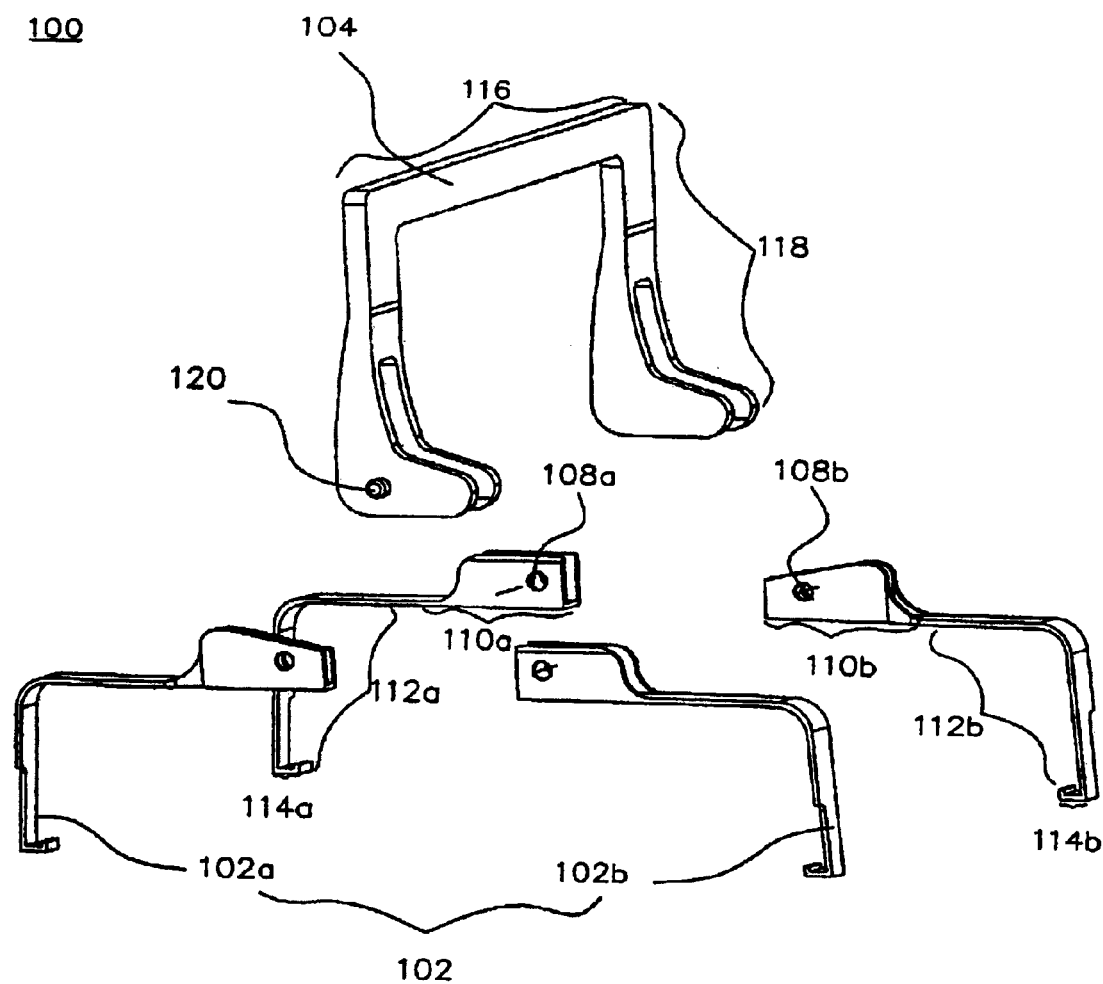
FIG. 2 is an exploded view of part of the retaining apparatus in FIG. 1.
Figure 3:
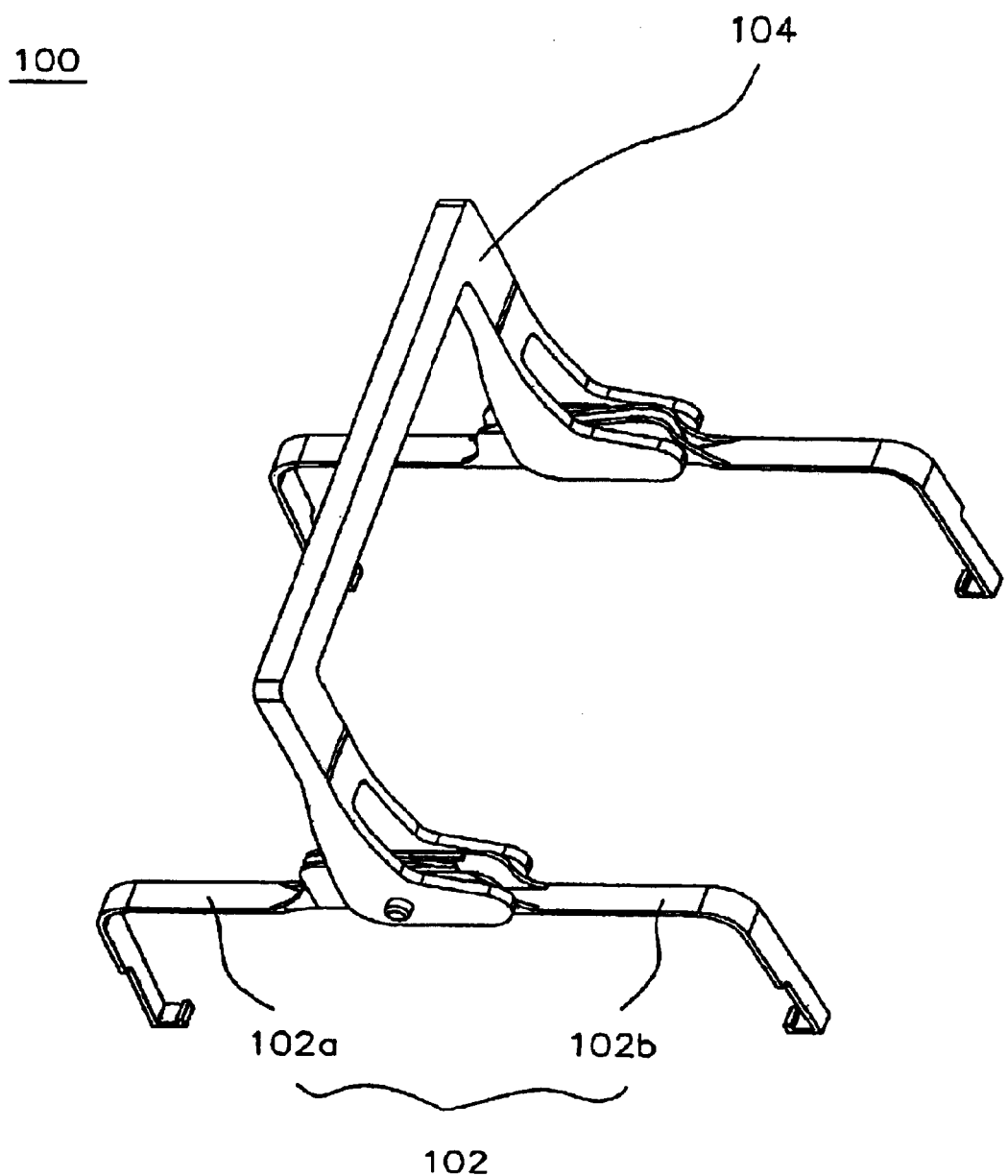
FIG. 3 is a schematic view of the retaining apparatus in FIG. 2.

With simultaneous reference to FIGS. 1 to 3, the disclosed retaining apparatus 100 is comprised of a retaining arm 102 and a retainer clip 104. The retaining arm 102 is formed by combining separate joint arms 102a, 102b. After combining the two joint arms 102a, 102b, there is still some room for actions. The joint arm 102a can be divided into a connection part 110a, an arm 112a, and a retaining part 114a Likewise, the joint arm 102b can be divided into a connection part 110b, an arm 112b, and a retaining part 114b. The connection parts 110a, 110b match with each other so that the joint arms 102a, 102b can be readily combined. The connection can be in an embedding form or a joint form. The arms 112a, 112b are the main parts of the joint arms 102a, 102b. Their forms are determined according to the structure of the retained object or the purposes. For example, they can have an L shape. The retaining parts 114a, 114b have the structure corresponding to the retaining part of the retained object. For example, it can be in a hook form, an embedding form, a joint form, or a clipping form.

The retainer clip 104 can be divided into a retainer clip body 116 and a positioning part 118. The number of the positioning parts 118 is determined by the number of the retaining arms 102. The positioning part 118 matches with the retaining arm 102. More specifically, the positioning part 118 and the connection parts 110a, 110b of the retaining arm 102 are combined together. The connection between the retainer clip 104 and the retaining arm 102 is in such a way that the retainer clip 104 and the retaining arm 102 are still movable relative to each other. Examples include the hooking means, the screw-mounting means, and the clipping means. On the other hand, the shape of the positioning part 118 is designed for a rotation mechanism, such as an L shape. The rotation mechanism refers to the mechanism that the retainer clip 104 can readily rise or descend along a specific track on the base 106 by rotating the retainer clip 104.

The disclosed retaining apparatus 100 can also include a base 106. The base 106 has positioning grooves 128 and positioning holes 124. The positioning grooves 128 fix the retaining arm 102 at a specific position on the base 106. Each positioning groove 128 has a shape corresponding to the retaining arm 102. The positioning holes 124 allow the retainer clip 104 to be fixed on the base 106. The retainer clip 104 can rise or fall along the positioning holes 124. Each positioning hole 124 has a width slightly larger than the maximal width of a fixing bolt 120 and has a specific track shape.

Moreover, the base 106 can be formed with connection parts 122, which are used to hold a heat-dissipating component such as a fan 203 (see FIG. 3). This can enhance the heat dissipation from the retainer object. The base can be formed with fixing parts 126 to tightly hold the retainer clip 104 on the base 106. In this case, the retaining arm 102 is simultaneously fixed on the retaining frame 202 to be explained later.

Figure 4:
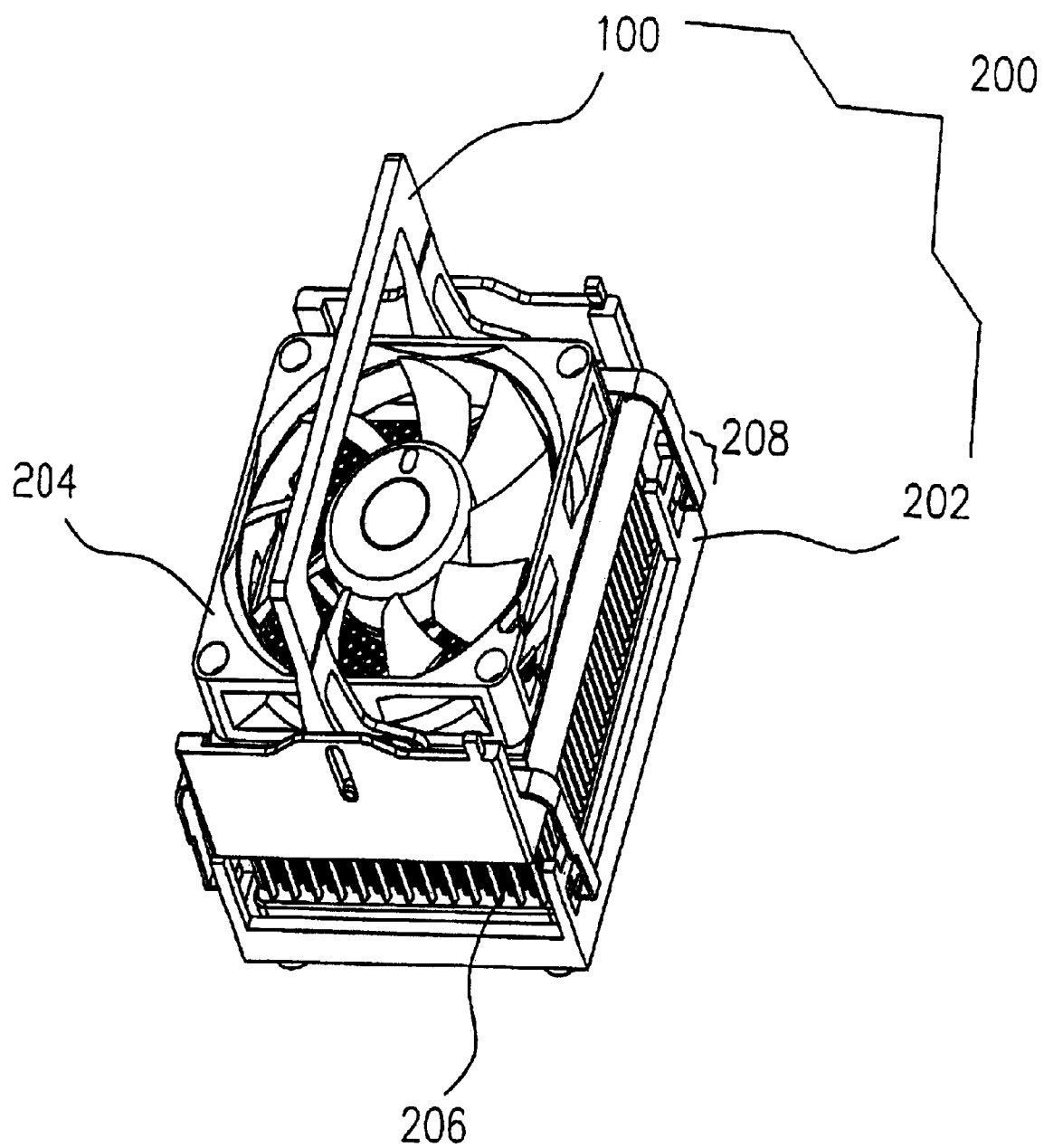
FIG. 4 is a schematic view of an application of the retaining apparatus in a preferred embodiment of the invention.

With reference to FIG. 4, the invention also includes a retaining frame 202 in addition to the retaining apparatus 100 shown in FIGS. 1 and 2. The retaining frame 202 has connection parts 208 corresponding to the retaining apparatus 100. Through the connection between the retaining frame and the retaining apparatus 100, all components (including heat-dissipating component and the heat-generating component) are tightly combined together. The shape of the connection part 208 is determined by that of the retaining parts 114a, 114b of the retaining arm 102.

Although we use two retaining arms in the embodiment to explain the spirit of the invention, it is however not limited by the example. One can simply generalize the design to using a single retaining arm or more than two retaining arms.

Here we use an embodiment to explain the connection among the retainer clip 104, the retaining arm 102, and the base 106. First, we form corresponding fixing holes 108a, 108b on the connection parts 110a, 110b. Afterwards, the two connection parts 110a, 110b are combined together. In the embodiment, the fixing holes 108a, 108b are on the same axis.

The positioning parts 118 of the retainer clip 104 hold the connection parts 110a, 110b. The fixing bolts 120 (the protruding parts on the inner sides of the positioning parts 118) penetrate through the fixing holes 108a, 108b, connecting the retainer clip 104 and the retaining arm 102. The joint arms 102a, 102b of the retaining arm 102 can rotate together or separately within a limited space with respect to the fixing bolts 120.

Afterwards, the retainer clip 104 and the retaining arm 102 are disposed on the base 106. The retaining arm 102 is embedded into the positioning grooves 128 and the fixing bolts 120 are fixed into the positioning holes 124, fixing the retainer clip 104 on the base 106. The retainer clip 104 can rotate on the base 106 as mentioned before. In an explicit embodiment, the positioning holes 124 are designed to have a long stripe shape whose width corresponds to the maximal thickness of the fixing bolt 120. In this manner, the fixing bolts 120 can readily slide along a specific track formed by the positioning holes 120 once they are inserted into the positioning holes 124. Moreover, the fixing bolts 120 will not depart from the positioning holes 124, thereby fixing the retainer clip 104 on the base 106.

With simultaneous reference to FIGS. 1 to 4, we use a central processing unit (CPU) as the heat-generating component to explain how to use the disclosed retaining apparatus 200. First, a heat-dissipating component 206 is disposed on the CPU (not shown). The heat-dissipating component 206 can be a heat sink, a heat pipe, or a fan. The heat-dissipating component 206 and the CPU are placed on the retaining frame 202 (FIG. 3 shows that the CPU is held between the heat-dissipating component 206 and the retaining frame 202). The retaining apparatus 100 is disposed on the heat-dissipating component 206. Afterwards, the retainer clip 104 is rotates to be fixed on the fixing parts 126. At this moment, the retaining parts 114a, 114b of the retaining arm 102 are combined with the connection parts 208. Therefore, the heat-dissipating component 206 inside the retaining apparatus 200 is tightly connected to the CPU.

To increase the heat dissipation efficiency of the heat-dissipating component 206, another heat-dissipating component can be installed on the retaining apparatus 200. For example, one can install a fan 204 on the retaining apparatus 200 or directly on the heat-dissipating component 206.

From the above descriptions of the disclosed retaining apparatus and how to use it, one sees that there is still some room for motion between the two joint arms as the retaining arm is comprised of two separate joint arms. Therefore, the retaining size of the retaining arm can be readily adjusted. One can easily install the retaining arm on the retaining frame or a substrate by imposing only a small force.

Furthermore, since the retaining arm can be easily installed on or separated from a retaining frame or a substrate by rotating the retainer clip, the invention does not require the use of additional tools or skills. A simple action can quickly mount or dismount the disclosed retaining apparatus.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A retaining apparatus, comprising:
   a retaining arm, which is obtained by combining a first joint arm and a second joint arm with a specific motion space in between;
   a retainer clip, which is combined with the retaining arm; and
   a base, which is combined with the retainer clip with an action mechanism existing between the retainer clip and the base to rotate the first joint arm and the second joint arm symmetrically.

2. The retaining apparatus of claim 1 further comprising a retaining frame connected to the retaining arm.

3. The retaining apparatus of claim 2, wherein the retainer clip controls the connection between the retaining frame and the retaining arm through the action mechanism.

4. The retaining apparatus of claim 2, wherein the action mechanism tightly attaches a first heat-dissipating component to a heat-generating component when the first heat-dissipating component and the heat-generating component are held between the retaining frame and the base.

5. The retaining apparatus of claim 4, wherein the first heat-dissipating component is connected with a second heat-dissipating component.

6. The retaining apparatus of claim 1, wherein the base further includes a connection part for connecting to a second heat-dissipating component.

7. The retaining apparatus of claim 1, wherein the action mechanism refers to the rotation of the retainer clip.

8. A retaining apparatus, comprising:

a first joint arm;

a second joint arm, which is combined with the first joint arm to form a retaining arm with a specific motion space existing between the combined first joint arm and second joint arm; and a retainer clip, which is combined with the retaining arm with an action mechanism existing between the retainer clip and the retaining arm to rotate the first joint arm and the second joint arm symmetrically.

9. The retaining apparatus of claim 8 further comprising a retaining frame connecting to the retaining arm.

10. The retaining apparatus of claim 9, wherein the retainer clip controls the connection between the retaining frame and the retaining arm through the action mechanism.

11. The retaining apparatus of claim 9, wherein the action mechanism tightly attaches a first heat-dissipating component to a heat-generating component when the first heat-dissipating component and the heat-generating component are held between the retaining frame and a base.

12. The retaining apparatus of claim 11, wherein the first heat-dissipating component is connected with a second heat-dissipating component.

13. A retaining apparatus, comprising:

a plurality of retaining arms, each of which is obtained by combining a first joint arm and a second joint arm with a specific motion space existing in between;

a retainer clip, which is combined with the plurality of retaining arms; and a base, which is combined with the retainer clip with an action mechanism existing in between to rotate the first joint arm and the second joint arm symmetrically.

14. The retaining apparatus of claim 13 further comprising a retaining frame connecting to the retaining arm.

15. The retaining apparatus of claim 14, wherein the retainer clip controls the connection between the retaining frame and the retaining arm through the action mechanism.

16. The retaining apparatus of claim 13, wherein the action mechanism tightly attaches a first heat-dissipating component to a heat-generating component when the first heat-dissipating component and the heat-generating component are held between the retaining frame and the base.

17. The retaining apparatus of claim 16, wherein the first heat-dissipating component is connected with a second heat-dissipating component.

18. The retaining apparatus of claim 17, wherein the second heat-dissipating component is a fan.

19. The retaining apparatus of claim 13, wherein the action mechanism refers to the rotation of the retainer clip.

20. The retaining apparatus of claim 13, wherein the base further includes a connection part for connecting to a second heat-dissipating component.

* * * * *